US010777139B2

(12) United States Patent
Tsuboi

(10) Patent No.: US 10,777,139 B2
(45) Date of Patent: Sep. 15, 2020

(54) LIGHT EMITTING DEVICE AND IMAGING APPARATUS

(71) Applicant: CANON KABUSHIKI KAISHA, Tokyo (JP)

(72) Inventor: Hiromasa Tsuboi, Tama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 50 days.

(21) Appl. No.: 15/970,354

(22) Filed: May 3, 2018

(65) Prior Publication Data
US 2018/0342207 A1 Nov. 29, 2018

(30) Foreign Application Priority Data
May 29, 2017 (JP) .................. 2017-105986

(51) Int. Cl.
G09G 3/3258 (2016.01)
G09G 3/3233 (2016.01)
H01L 51/50 (2006.01)
H01L 51/52 (2006.01)

(52) U.S. Cl.
CPC ......... G09G 3/3258 (2013.01); G09G 3/3233 (2013.01); H01L 51/5012 (2013.01); G09G 2300/0819 (2013.01); G09G 2300/0852 (2013.01); G09G 2300/0861 (2013.01); G09G 2310/0251 (2013.01); G09G 2310/0262 (2013.01); G09G 2310/0264 (2013.01); G09G 2320/043 (2013.01); H01L 51/5203 (2013.01)

(58) Field of Classification Search
CPC ............... G09G 3/3258; G09G 3/3233; G09G 2300/0819; G09G 2310/0262; G09G 2310/0251; G09G 2300/0861; G09G 2300/0852; G09G 2320/043; G09G 2310/0264; H01L 51/5012; H01L 51/5203
See application file for complete search history.

(56) References Cited

U.S. PATENT DOCUMENTS

| 7,580,015 | B2* | 8/2009 | Tai ........................ G09G 3/3233 345/204 |
| 8,477,085 | B2* | 7/2013 | Shishido ............... G09G 3/3233 315/169.3 |
| 9,852,690 | B2* | 12/2017 | Tsuge .................... G09G 3/3258 |
| 10,008,149 | B2* | 6/2018 | Inoue .................... G09G 3/3233 |

(Continued)

FOREIGN PATENT DOCUMENTS

JP 2010-145579 A 7/2010
JP 2010145579 A * 7/2010
(Continued)

Primary Examiner — Amy Onyekaba
(74) Attorney, Agent, or Firm — Canon U.S.A., Inc. IP Division

(57) ABSTRACT

A light emitting device includes a light emitting element, a driving transistor configured to control driving of the light emitting element, a threshold correction unit configured to perform compensation for a voltage corresponding to a threshold of the driving transistor, and an electric potential setting unit configured to set an electric potential of a node between the driving transistor and the light emitting element, wherein the electric potential setting unit sets a first electric potential and a second electric potential different from the first electric potential, at the node.

20 Claims, 6 Drawing Sheets

(56) References Cited

U.S. PATENT DOCUMENTS

| | | | | |
|---|---|---|---|---|
| 10,607,539 B2* | 3/2020 | Chen | | G09G 3/3266 |
| 2003/0137503 A1* | 7/2003 | Kimura | | G09G 3/3283 |
| | | | | 345/212 |
| 2006/0082528 A1* | 4/2006 | Guo | | G09G 3/3233 |
| | | | | 345/82 |
| 2006/0221005 A1* | 10/2006 | Omata | | G09G 3/3241 |
| | | | | 345/76 |
| 2006/0238461 A1* | 10/2006 | Goh | | G09G 3/3233 |
| | | | | 345/76 |
| 2007/0040769 A1* | 2/2007 | Tai | | G09G 3/3233 |
| | | | | 345/76 |
| 2007/0273620 A1* | 11/2007 | Yumoto | | G09G 3/32 |
| | | | | 345/76 |
| 2008/0030446 A1* | 2/2008 | Asano | | G09G 3/3266 |
| | | | | 345/87 |
| 2008/0036706 A1* | 2/2008 | Kitazawa | | G09G 3/3233 |
| | | | | 345/76 |
| 2008/0111804 A1* | 5/2008 | Choi | | G09G 3/3233 |
| | | | | 345/205 |
| 2008/0170010 A1* | 7/2008 | Kim | | G09G 3/3233 |
| | | | | 345/76 |
| 2008/0198104 A1* | 8/2008 | Yamashita | | G09G 3/3258 |
| | | | | 345/77 |
| 2008/0224965 A1* | 9/2008 | Kim | | G09G 3/3233 |
| | | | | 345/76 |
| 2009/0085903 A1 | 4/2009 | Yamashita | | |
| 2009/0179838 A1* | 7/2009 | Yamashita | | G09G 3/3233 |
| | | | | 345/84 |
| 2009/0219234 A1* | 9/2009 | Yamamoto | | G09G 3/3233 |
| | | | | 345/80 |
| 2009/0273547 A1* | 11/2009 | Tanikame | | G09G 3/3291 |
| | | | | 345/76 |
| 2009/0278771 A1* | 11/2009 | Yamamoto | | G09G 3/3233 |
| | | | | 345/76 |
| 2009/0278834 A1* | 11/2009 | Tomida | | G09G 3/3233 |
| | | | | 345/211 |
| 2009/0295785 A1* | 12/2009 | Yamamoto | | G09G 3/3233 |
| | | | | 345/214 |
| 2010/0026729 A1* | 2/2010 | Toyomura | | G09G 3/3233 |
| | | | | 345/690 |
| 2010/0033477 A1* | 2/2010 | Yamashita | | G09G 3/3233 |
| | | | | 345/215 |
| 2010/0033511 A1* | 2/2010 | Yamashita | | G09G 3/3233 |
| | | | | 345/690 |
| 2010/0053233 A1* | 3/2010 | Ishiguro | | G09G 3/30 |
| | | | | 345/690 |
| 2010/0059659 A1* | 3/2010 | Klinghult | | H05B 41/325 |
| | | | | 250/205 |
| 2010/0259468 A1* | 10/2010 | Omoto | | H01L 27/3262 |
| | | | | 345/77 |
| 2011/0109610 A1* | 5/2011 | Yamamoto | | G09G 3/325 |
| | | | | 345/211 |
| 2011/0148847 A1* | 6/2011 | Ikeda | | G09G 3/3233 |
| | | | | 345/212 |
| 2011/0157133 A1* | 6/2011 | Ogura | | G09G 3/3291 |
| | | | | 345/211 |
| 2012/0098805 A1* | 4/2012 | Kubota | | G09G 3/003 |
| | | | | 345/205 |
| 2012/0313922 A1* | 12/2012 | Toyomura | | G09G 3/3233 |
| | | | | 345/212 |
| 2012/0327058 A1* | 12/2012 | Minami | | G09G 3/3225 |
| | | | | 345/211 |
| 2013/0021316 A1* | 1/2013 | Inoue | | H01L 27/1225 |
| | | | | 345/212 |
| 2014/0035797 A1* | 2/2014 | Jinta | | G09G 3/3233 |
| | | | | 345/77 |
| 2014/0218273 A1* | 8/2014 | Tanikame | | H01L 27/3262 |
| | | | | 345/77 |
| 2015/0138253 A1* | 5/2015 | Kimura | | H01L 27/3248 |
| | | | | 345/690 |
| 2015/0294626 A1* | 10/2015 | Bi | | G09G 3/3233 |
| | | | | 345/211 |
| 2015/0339974 A1* | 11/2015 | Wu | | G09G 3/3233 |
| | | | | 345/690 |
| 2016/0210896 A1* | 7/2016 | Gil | | H01L 51/00 |
| 2017/0018229 A1* | 1/2017 | Zhang | | G09G 3/3233 |
| 2018/0301085 A1* | 10/2018 | Han | | G09G 3/3266 |
| 2019/0057648 A1* | 2/2019 | Xu | | H01L 27/3262 |
| 2019/0266951 A1* | 8/2019 | Uchino | | H04B 10/501 |

FOREIGN PATENT DOCUMENTS

| | | |
|---|---|---|
| JP | 2011-039269 A | 2/2011 |
| WO | 02/075710 A1 | 9/2002 |

* cited by examiner

LIGHT EMITTING DEVICE AND IMAGING APPARATUS

BACKGROUND OF THE INVENTION

Field of the Invention

The aspect of the embodiments relates to a light emitting device or an imaging apparatus, and relates to, for example, a light emitting device having an organic electroluminescence (EL) element, or an imaging apparatus having the light emitting device.

Description of the Related Art

Japanese Patent Application Laid-Open No. 2010-145579 discusses selectively supplying a voltage Vss satisfying Vss<Vthel+Vcath to the anode of an organic electroluminescence (EL) element by a switching transistor. In this way, a reverse bias is applied to the organic EL element in Japanese Patent Application Laid-Open No. 2010-145579. Japanese Patent Application Laid-Open No. 2010-145579 also discusses threshold correction processing for correcting a threshold variation for each pixel in a driving transistor. WO02/075710 discusses another related technique. According to this technique, an electric circuit is provided to precharge a capacitor of a light emitting element with electric charge of a light emission threshold or less, thereby reducing the time until the start of light emission.

In recent years, light emitting devices have been applied to display apparatuses. In a display apparatus, a moving image can be smoothly displayed, or a preview of a captured image can be precisely displayed, by speeding up the driving of a light emitting element. Japanese Patent Application Laid-Open No. 2010-145579 and WO02/075710 do not discuss speeding up the driving of an organic light emitting device.

SUMMARY OF THE INVENTION

An aspect of the embodiments relates to a light emitting device that includes a light emitting element, a first transistor in which one of a source and a drain is connected to the light emitting element, a second transistor connected to a node between the first transistor and the light emitting element, a third transistor connected between a gate of the first transistor and a signal line, and a fourth transistor connected between another of the source and the drain of the first transistor and a power supply line, wherein the node is connected to a terminal via the second transistor, the terminal being configured to have at least a first electric potential and a second electric potential different from the first electric potential.

Another aspect of the embodiments relates to a light emitting device that includes a light emitting element, a driving transistor configured to control driving of the light emitting element, a threshold correction unit configured to perform compensation for a voltage corresponding to a threshold of the driving transistor, and an electric potential setting unit configured to set an electric potential of a node between the driving transistor and the light emitting element, wherein the electric potential setting unit sets a first electric potential and a second electric potential different from the first electric potential, at the node.

Further features of the disclosure will become apparent from the following description of exemplary embodiments with reference to the attached drawings.

DESCRIPTION OF THE EMBODIMENTS

A light emitting device according to each exemplary embodiment will be described below with reference to the drawings. Each exemplary embodiment to be described below represents an example of the disclosure, and numerical values, shapes, materials, components, and arrangement as well as connection configuration of components do not limit the disclosure.

Figure 1:
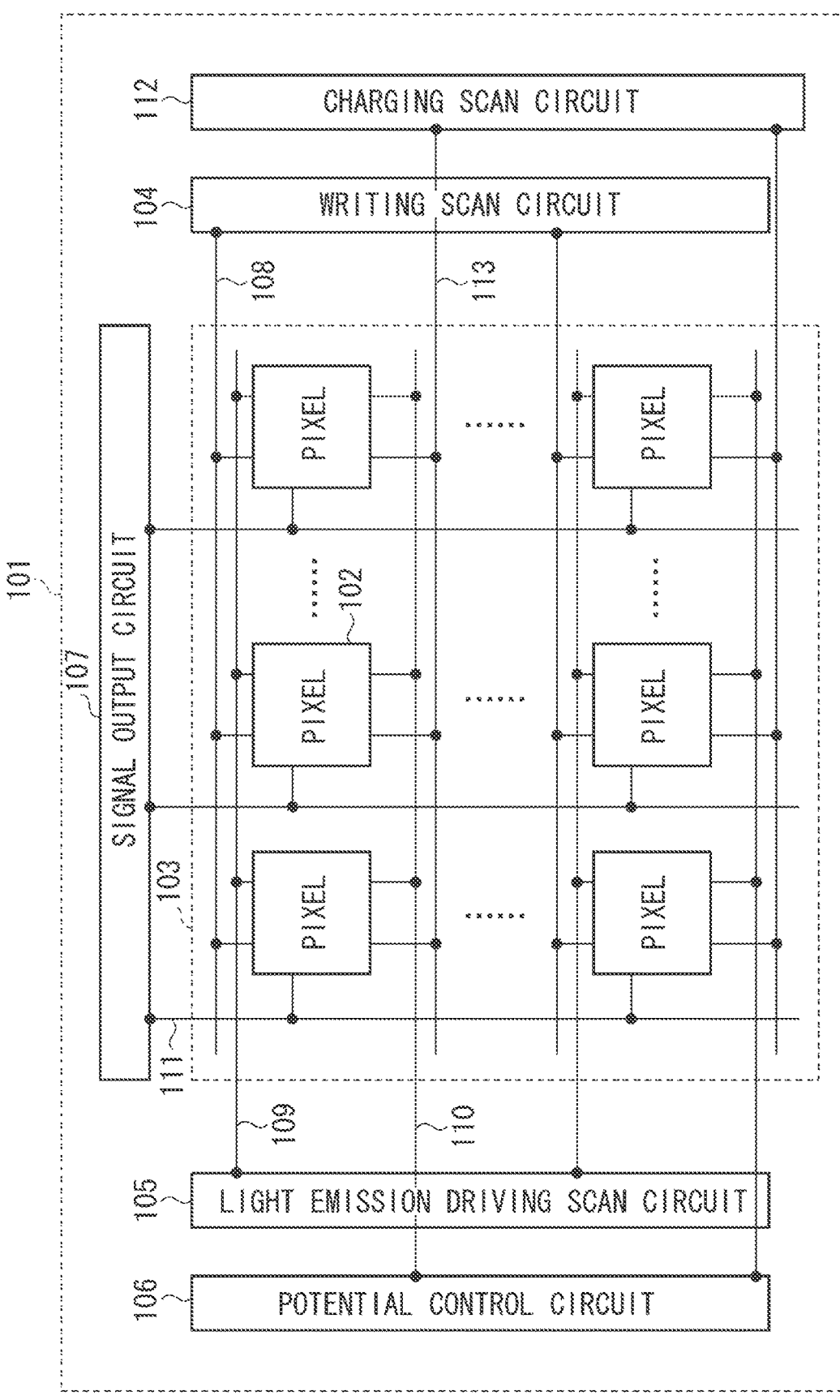
FIG. 1 is a system diagram illustrating an example of a part of a light emitting device according to a first exemplary embodiment.
Figure 2:
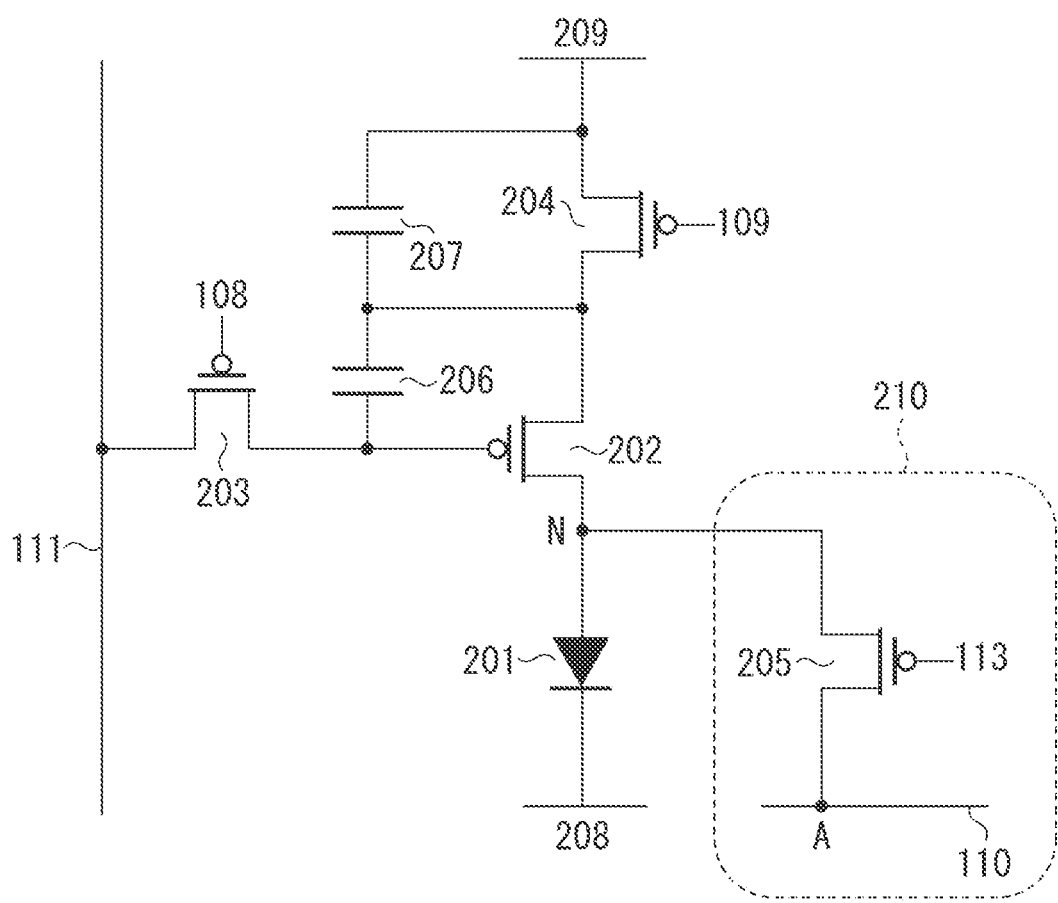
FIG. 2 is a circuit diagram illustrating an example of a pixel of the light emitting device according to the first exemplary embodiment.
Figure 3:
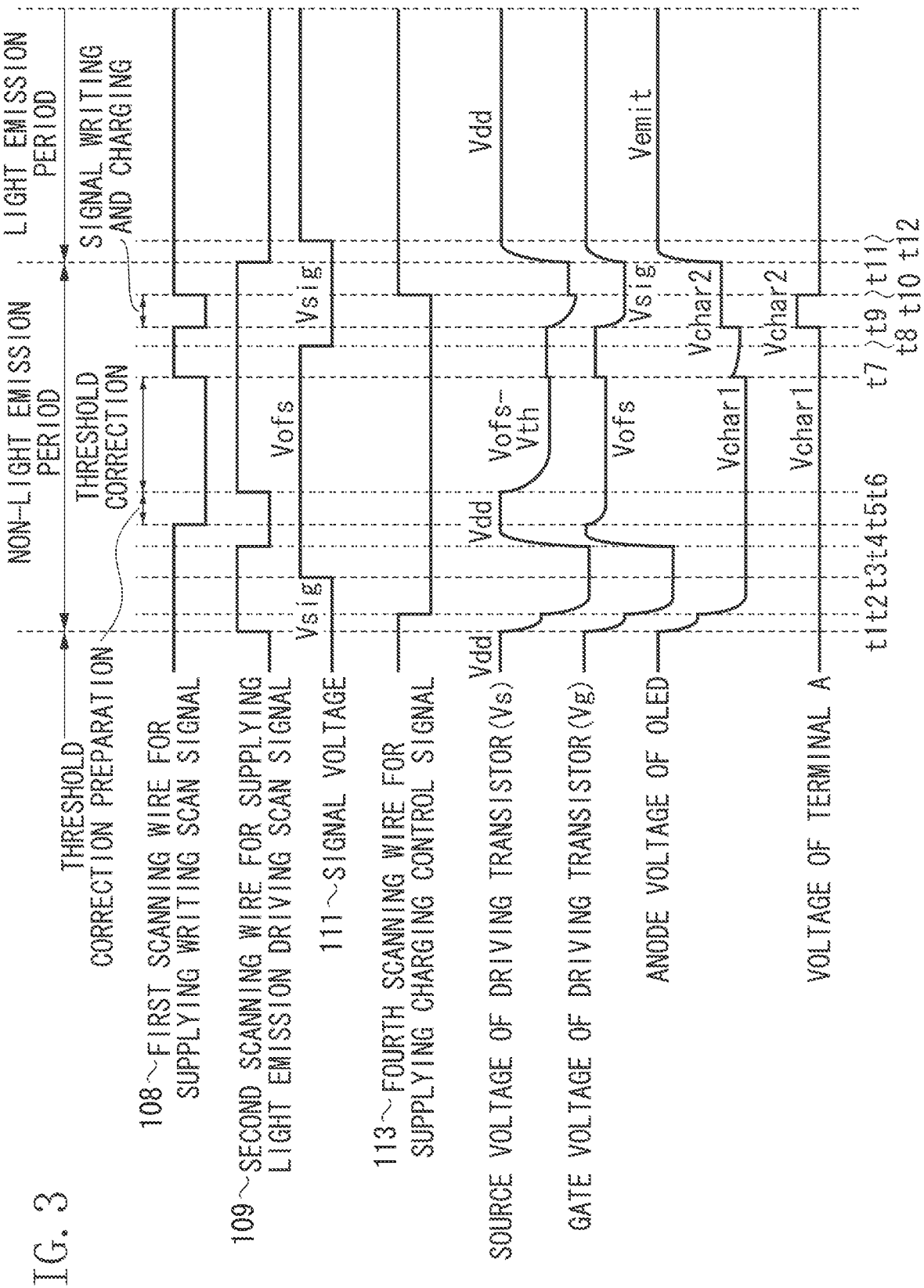
FIG. 3 is a diagram illustrating a driving timing waveform of the light emitting device according to the first exemplary embodiment.

FIG. 1 is a schematic system diagram illustrating an example of a part of an organic light emitting device according to a first exemplary embodiment. FIG. 2 is a circuit diagram illustrating an example of a pixel included in the organic light emitting device illustrated in FIG. 1. FIG. 3 is a timing waveform diagram illustrating an example of the driving of the pixel illustrated in FIG. 2.

There will be described below a case where a driving transistor is connected to the positive electrode of an organic light emitting device and all transistors are P-type transistors. However, an organic light emitting device according to an exemplary embodiment of the disclosure is not limited to this case. The polarity and the conductivity type may each be the opposite one. Further, the driving transistor may be provided as a P-type transistor while other transistors may each be provided as an N-type transistor. Electric potential to be supplied, connection, and driving may be changed as appropriate, depending on the conductivity type and the polarity. Furthermore, portions provided with the same numerals in the drawings refer to the same element.

An organic light emitting device 101 is, for example, an organic electroluminescence (EL) display device. The organic light emitting device 101 has a pixel array unit 103 and a drive unit disposed around the pixel array unit 103, as illustrated in FIG. 1. The pixel array unit 103 has a plurality of pixels 102 two-dimensionally arranged in a matrix. Each of the pixels 102 has an organic light emitting element 201 (illustrated in FIG. 2). The organic light emitting element 201 has an organic layer including a light emission layer between two electrodes. The organic layer may appropriately have, in addition to the light emission layer, one or a plurality of layers including a hole injection layer, a hole transport layer, an electron injection layer, and an electron transport layer.

The drive unit is a circuit for driving each of the pixels 102. The drive unit includes a writing scan circuit 104, a light emission driving scan circuit 105, a potential control circuit 106, a signal output circuit 107, and a charging scan circuit 112. In the pixel array unit 103, a first scanning wire 108, a second scanning wire 109, a third scanning wire 110, and a fourth scanning wire 113 are each disposed along a row direction, for each pixel row. In addition, a signal line 111 is disposed along a column direction, for each pixel column.

The first scanning wire 108 is connected to an output terminal of a corresponding row, in the writing scan circuit 104. The second scanning wire 109 is connected to an output terminal of the light emission driving scan circuit 105. The third scanning wire 110 is connected to an output terminal of the potential control circuit 106, and the fourth scanning wire 113 is connected to the charging scan circuit 112. The signal line 111 is connected to an output terminal of the signal output circuit 107.

The writing scan circuit 104 supplies a writing scan signal to the first scanning wire 108, at the time of writing a video signal and at the time of threshold correction for each of the pixels 102 of the pixel array unit 103. The light emission driving scan circuit 105 supplies the second scanning wire 109 with a light emission driving signal for driving the pixel 102 to cause light emission.

The potential control circuit 106 supplies an electric current to the third scanning wire 110, at the time of threshold correction to be described below, and at the time of charging operation. The supplied electric current corresponds to an electric potential to be set at a connecting portion (a node N) between the organic light emitting element 201 and a driving transistor 202. The charging scan circuit 112 supplies the fourth scanning wire 113 with a charging control signal for controlling the supply of an electric current for operation such as the charging operation. The signal output circuit 107 appropriately selects either a luminance signal having a voltage (hereinafter referred to as a signal voltage Vsig) corresponding to luminance information, and a reference voltage signal having a reference voltage Vofs. The signal output circuit 107 outputs the selected signal.

As illustrated in FIG. 2, the pixel 102 has the organic light emitting element 201, the driving transistor 202, a writing transistor 203, a light emission driving transistor 204, a first capacitative element 206, a second capacitative element 207, and an electric potential setting unit 210. In the present exemplary embodiment, an example in which the electric potential setting unit 210 has a terminal A and a charging transistor 205 will be described. The terminal A is connected to the third scanning wire 110.

Here, as for the total number of transistors and capacitative elements, and the combination of the conductivity types of transistors, only an example is described, and the present configuration is not limitative. Further, in a case where a transistor is connected between elements A and B, one of the source and the drain of the transistor is connected to one of the elements A and B, and the other of the source and the drain of the transistor is connected to the other of the elements A and B. Thus, such a case where the gate of a transistor is connected to one of elements A and B, one of the source and the drain of the transistor is connected to the other of the elements A and B, and the other of the source and the drain is not connected to the one of the elements A and B is not included.

In a specific configuration, one of the source and the drain (in FIG. 2, the drain) of the driving transistor 202 is connected to a first electrode of the organic light emitting element 201. A second electrode of the organic light emitting element 201 is connected to a first power supply potential 208 (hereinafter referred to as Vss). One of the source and the drain of the charging transistor 205 is connected to the node N between the drain of the driving transistor 202 (a first transistor) and the organic light emitting element 201. The node N is connected to the terminal A (an electric potential Vchar) via the charging transistor 205. The terminal A is connected to the third scanning wire 110. The gate of the charging transistor 205 is connected to the fourth scanning wire 113.

One of the source and the drain of the writing transistor 203 is connected to the gate of the driving transistor 202, and the other of the source and the drain of transistor 203 is connected to the signal line 111. The gate of the writing transistor 203 is connected to the first scanning wire 108.

One of the source and the drain (here, the drain) of the light emission driving transistor 204 is connected to the other of the source and the drain of the driving transistor 202. The other (here, the source) of the light emission driving transistor 204 is connected to a second power supply line 209 (a power supply potential Vdd). The gate of the light emission driving transistor 204 is connected to the second scanning wire 109.

Here, the electric potential Vchar of the terminal A can be selected from at least an electric potential Vchar1 and an electric potential Vchar2. In other words, the electric potential Vchar1 and the electric potential Vchar2 can be supplied from the terminal A by the potential control circuit 106. The electric potential Vchar1 and the electric potential Vchar2 are values different from each other. Here, the node N is connected to the positive electrode of the organic light emitting element 201 and therefore, the electric potential Vchar1 is lower than the electric potential Vchar2.

Further, the first capacitative element 206 is connected between the gate and the source of the driving transistor 202. The first capacitative element 206 may be a parasitic capacitance. In one embodiment, a configuration having a capacitance value sufficient to drive the organic light emitting element 201 stably in a light emission period is provided. Therefore, the first capacitative element 206 may have a metal-insulator-metal (MIM) structure. The first capacitative element 206 has, for example, a conductive layer connected to the gate of the driving transistor 202, a conductive layer connected to a connecting portion between the driving transistor 202 and the light emission driving transistor 204, and an insulation layer disposed between these two conductive layers.

The second capacitative element 207 is connected between the source of the driving transistor 202 and the power supply line 209. The second capacitative element 207 may be a parasitic capacitance, but may have a MIM structure. The second capacitative element 207 has, for example, a conductive layer connected to a wire that connects the driving transistor 202 and the light emission driving transistor 204, a conductive layer connected to a wire connected to the source of the light emission driving transistor 204, and an insulation layer disposed between these two conductive layers.

A material other than metal, such as polysilicon or a diffusion layer, may be used for the conductive layers of the first capacitative element 206 and the second capacitative element 207. In a case where the first capacitative element 206 is a parasitic capacitance, a gate-drain capacitance of the driving transistor 202 can be used.

The driving transistor 202 is designed to operate in a subthreshold region at the time of light emission of the organic light emitting element 201. Therefore, in response to supply of an electric current from the power supply line 209 via the light emission driving transistor 204, the driving transistor 202 drives the organic light emitting element 201 in current driving to cause light emission. To be more specific, the driving transistor 202 operates in the subthreshold region, thereby supplying the organic light emitting element 201 with a driving current of an electric current value corresponding to a gate voltage, i.e., the signal voltage Vsig of a luminance signal retained at the first capacitative element 206. Therefore, the organic light emitting element 201 is current-driven to emit light.

The writing transistor 203 enters a conducting state, in response to a writing scan signal applied to the gate from the writing scan circuit 104 via the first scanning wire 108. The writing transistor 203 thereby samples the signal voltage Vsig of a video signal according to luminance information, or the reference voltage Vofs supplied from the signal output circuit 107 via the signal line 111. The writing transistor 203 writes the sampled voltage to the pixel 102. The written signal voltage Vsig or reference voltage Vofs is applied to the gate of the driving transistor 202 and retained at the first capacitative element 206.

The light emission driving transistor 204 enters a conducting state, in response to a light emission driving signal applied to the gate from the light emission driving scan circuit 105 via the second scanning wire 109. The light emission driving transistor 204 thereby allows the supply of an electric current from the power supply line 209 to the driving transistor 202. This enables the light emission of the organic light emitting element 201 by the driving transistor 202, as described above. In other words, the light emission driving transistor 204 has a function as a transistor for controlling light emission/non-light emission of the organic light emitting element 201.

In this way, the light emission driving transistor 204 performs switching operation, thereby providing a period in which the organic light emitting element 201 is in a non-light emission state (a non-light emission period). This enables control of the ratio between the light emission period and the non-light emission period of the organic light emitting element 201 (a so-called duty control). This duty control can reduce an image lag blur that results from light emission of the pixel 102 over one frame period. In particular, the duty control can improve the quality of a moving image.

The charging transistor 205 enters a conducting state, in response to a charging control signal applied from the charging scan circuit 112 to the gate via the fourth scanning wire 113. This controls supply/non-supply of an electric current corresponding to the electric potential Vchar1 or the electric potential Vchar2 to the electrode of the organic light emitting element 201. To one of the source and the drain of the charging transistor 205, a signal of the electric potential Vchar is supplied from the terminal A via the third scanning wire 110, by the potential control circuit 106. As described above, at least the electric potential Vchar1 and the electric potential Vchar2 higher than the electric potential Vchar1 are selectively supplied to the terminal A, as the electric potential Vchar.

The organic light emitting element 201 is an organic EL element. At the time of light emission of the organic EL element, the amount of electric current through the driving transistor 202 is changed according to a luminance. The capacitance of the electrode of the organic light emitting element 201 is thereby charged to a predetermined electric potential, so that an electric current corresponding to a potential difference between the two electrodes of the organic light emitting element 201 flows therebetween. The organic light emitting element 201 thereby emits light of a predetermined luminance. In other words, the electric potential of the electrode of the organic light emitting element 201 (the electric potential of the node N in FIG. 2) is controlled in such a manner that an electric current corresponding to a luminance flows through the organic light emitting element 201.

At this time, in particular, at a low luminance, the amount of electric current flowing through the driving transistor 202 is small and therefore, it takes a long time to charge the capacitance of the organic light emitting element 201 to the predetermined electric potential. This leads to deterioration in responsiveness of a luminance to an input signal. Therefore, in the present exemplary embodiment, the electric potential setting unit 210 is provided. An electric current corresponding to the electric potential Vchar2 is thereby supplied to the electrode of the organic light emitting element 201 for charging, before the light emission of the organic light emitting element 201. This can reduce the charging time of the electrode of the organic light emitting element 201, when the signal voltage Vsig corresponding to a luminance signal is applied to the gate of the driving transistor 202, and the light emission driving transistor 204 enters an ON state.

Specifically, in FIG. 2, the electric potential Vchar2 of the terminal A is supplied to the electrode of the organic light emitting element 201 via the charging transistor 205, during the charging operation. This can reduce the time between switching of the light emission driving transistor 204 to the ON state and light emission of the organic light emitting element 201. The electric potential Vchar2 of the terminal A at this moment allows a faster response, as the electric potential Vchar2 is closer to a voltage corresponding to a luminance signal.

Meanwhile, the charging operation is a part of the non-light emission period. Therefore, the electric potential Vchar2 of the terminal A is a value for not allowing light emission of the organic light emitting element 201, or a value within specifications of non-light emission for an image. In other words, even if light emission occurs, the light emission fall within such a range that light emission is recognized by a user as non-light emission. In one embodiment, the electric potential Vchar2 of the terminal A in the charging operation is high in the tolerance of the specifications of the organic light emitting element 201. In a case of such a configuration that the negative electrode of the organic light emitting device is connected to a transistor such as the driving transistor 202, the electric potential Vchar2 of the terminal A in the charging operation is low in the tolerance of the specifications of the organic light emitting element 201.

The charging operation described above can improve the responsiveness of the organic light emitting element 201 to an input signal, thereby allowing faster driving.

On the other hand, the threshold of the driving transistor 202 varies for each pixel due to variation in production or the like, and deviates from the designed threshold, in some cases. In such cases, the electric potential of the electrode (the node N) of the organic light emitting element 201 varies for each pixel. The value of an electric current flowing through the organic light emitting element 201 therefore varies, even if the signal voltage Vsig corresponding to a common luminance signal is supplied. Hence, the luminance of light emission differs from a set value.

Therefore, threshold correction operation is performed. In this operation, a voltage corresponding to the threshold of the driving transistor 202 in each pixel is retained between the gate and the source of the driving transistor 202, before a luminance signal is input. This can reduce or eliminate a deviation from the design value of the driving transistor 202 in each pixel (variations in the threshold voltage among the pixels). A voltage corresponding to a desired luminance can be therefore applied to the electrode of the organic light emitting element 201.

Here, in the threshold correction operation, an electric current is fed between the power supply line 209 and the terminal A, via the light emission driving transistor 204 and the charging transistor 205. The light emission driving transistor 204 then enters an OFF state. Therefore, the electric current flows via the charging transistor 205, until a gate-source voltage of the driving transistor 202 is stabilized, i.e., to have a substantially constant value. The threshold correction is thus performed.

The driving transistor 202 is set to operate in a saturation region. However, due to a channel-length modulation effect, the amount of flowing electric current increases, if the source-drain voltage increases. In FIG. 2, if the electric potential Vchar of the terminal A is high at the time of the threshold correction, the source-drain voltage of the driving transistor 202 is small and therefore, it takes a long time before stabilization. In one embodiment, the electric potential Vchar1 of the terminal A at the time of the threshold correction is low. When the electric potential Vchar1 is low, the source-drain voltage of the driving transistor 202 can be larger.

Therefore, in the present exemplary embodiment, the potential control circuit 106 controls the electric potential Vchart of the terminal A, in such a manner that the electric potential Vchart takes different values to be suitable for each of the time of the threshold correction and the time of the charging operation. In the organic light emitting device illustrated in FIG. 2, the electric potential of the terminal A is the electric potential Vchar1, and the electric potential of the terminal A is the electric potential Vchar2 higher than the electric potential Vchar1 at the time of the charging operation. This can speed up the driving of the organic light emitting device, during the threshold correction and the charging operation.

A specific driving method for the organic light emitting device in the present exemplary embodiment will be described with reference to FIG. 3.

In a timing waveform diagram illustrated in FIG. 3, a period before a time t1 is a light emission period of the organic light emitting element 201 in the previous frame. In the light emission period, the light emission driving transistor 204 is in the ON state, and the writing transistor 203 and the charging transistor 205 are each in an OFF state.

A new frame begins from the time t1. At the time t1, the light emission driving transistor 204 enters the OFF state, thereby stopping the supply of electric current to the organic light emitting element 201 from the power supply line 209 via the driving transistor 202. The organic light emitting element 201 is thereby extinguished. The source potential of the driving transistor 202 and the gate potential of the driving transistor 202 both fall, until the organic light emitting element 201 is extinguished. At this time, the gate of the driving transistor 202 is connected to the source of the driving transistor 202 via the first capacitative element 206.

At a time t2, the charging transistor 205 enters an ON state, and thereby an electric current flows between the source of the driving transistor 202 and the terminal A. In the present exemplary embodiment, the threshold voltage of the charging transistor 205 is set to be higher than the threshold voltages of other transistors, and the charging transistor 205 is set to operate in a linear region. At this moment, because the light emission driving transistor 204 is in the OFF state, there occurs a fall in each of the source potential and the gate potential of the driving transistor 202, as well as the electric potential of the electrode (here, the positive electrode) of the organic light emitting element 201. The electric potential of each of the positive electrode of the organic light emitting element 201 and the drain of the driving transistor 202 becomes the electric potential Vchar1 that is substantially the same electric potential as the electric potential of the terminal A.

At a time t3, the signal output circuit 107 switches the electric potential of the signal line 111 from the signal voltage Vsig to the reference voltage Vofs. At a time t4, the light emission driving transistor 204 enters the ON state again. An electric current thereby flows from the power supply line 209 to the terminal A, via the driving transistor 202 and the charging transistor 205. In the present exemplary embodiment, a sufficiently low voltage is applied to the gate of the light emission driving transistor 204, and the light emission driving transistor 204 operates in a linear region and is set to function as a switch. Therefore, when the light emission driving transistor 204 is in the ON state, the power supply voltage Vdd, which is substantially the same as the power supply line 209, is applied to the source of the driving transistor 202.

As a result, the electric potential of the gate of the driving transistor 202 also rises. However, because the charging transistor 205 is in the ON state, there is almost no rise in the electric potential of the positive electrode of the organic light emitting element 201.

At a time t5, the writing transistor 203 enters an ON state. The reference voltage Vofs of the signal line 111 is thereby written to the gate of the driving transistor 202 via the writing transistor 203. When the writing transistor 203 is in the ON state, a sufficiently low voltage is applied to the gate of the writing transistor 203, and the writing transistor 203 operates in a linear region. Therefore, the writing transistor 203 also functions as a switch and thus, a voltage, which is substantially the same as the reference voltage Vofs from the signal line 111, is applied to the gate of the driving transistor 202.

A period for thus initializing the gate potential of the driving transistor 202 to the reference voltage Vofs is a threshold correction preparation period. At this moment, the electric potential of the source of the driving transistor 202 is substantially Vdd.

At a time t6, the light emission driving transistor 204 enters the OFF state. The electric potential of the source of the driving transistor 202 thereby changes from the power supply potential Vdd to an electric potential (Vofs-Vth) determined by subtracting a threshold voltage Vth of the driving transistor 202 from the reference voltage Vofs. The threshold voltage Vth of the driving transistor 202 is thereby retained at the first capacitative element 206. In this way, at each of the pixels 102, there is a period (a period from the time t6 to a time t7) in which the threshold voltage Vth of the driving transistor 202 (here, retained at the first capacitative element 206) is the gate-source voltage of the driving transistor 202. This period is a threshold correction period.

Therefore, the light emission driving transistor 204 functions as a threshold correction unit for performing compensation for the threshold voltage of the driving transistor 202. In the example illustrated in FIG. 3, the light emission driving transistor 204 and the first capacitative element 206 function as the threshold correction unit.

At the time t7, the writing transistor 203 enters the OFF state. In the present exemplary embodiment, there is described an example in which the electric potential Vchar of the terminal A is the electric potential Vchar1, over the entire period from the time t1 to the time t7. However, the organic light emitting device 101 of the present exemplary embodiment is not limited to this example.

For example, the electric potential Vchar of the terminal A may be the electric potential Vchar1, in at least a part of the period from the time t6 to the time t7, which is the threshold correction period. In one embodiment, when the light emission driving transistor 204 is switched to the OFF state (at the time t6) while the charging transistor 205 and the writing transistor 203 is in the ON state, the electric potential of the terminal A is the electric potential Vchar1. The organic light emitting element 201 can be thereby driven faster.

Therefore, in the threshold correction period, the gate-source voltage of the driving transistor 202 can be stabilized faster, as compared with a case where the electric potential of the terminal A is the electric potential Vchar2. Hence, it is possible to speed up the driving of the organic light emitting device 101.

At a time t8, the signal output circuit 107 switches the electric potential of the signal from the signal line 111, from the reference voltage Vofs to the signal voltage Vsig.

At a time t9, the writing transistor 203 and the charging transistor 205 enter the ON state. Further, the electric potential of the terminal A is switched from the electric potential Vchar1 to the electric potential Vchar2 that is higher than the electric potential Vchar1. When the writing transistor 203 enters the ON state, the signal voltage Vsig of the luminance signal is written to the gate of the driving transistor 202 via the writing transistor 203. A period for thus setting the electric potential of the gate of the driving transistor 202 to the signal voltage Vsig is a signal writing period.

When the electric potential of the terminal A is switched to the electric potential Vchar2, and the charging transistor 205 is brought into the ON state, the electric potential Vchar2 is written to the positive electrode of the organic light emitting element 201 via the charging transistor 205. As described above, the electric potential Vchar2 is an electric potential between the electric potential Vchar1 and the electric potential supplied to the positive electrode of the organic light emitting element 201 in the light emission period. In this way, the electric potential of the positive electrode of the organic light emitting element 201 is set to the electric potential Vchar2, before the start of the light emission of the organic light emitting element 201, after the threshold correction of the driving transistor 202. A period (the period from the time t9 to a time t10) in which such setting is performed is a charging period.

In other words, the electric potential of the terminal A is switched to the electric potential Vchar2, when the charging transistor 205 is switched from the ON state to the OFF state, before the light emission driving transistor 204 enters the ON state, after the threshold correction period. Hence, the electric potential of the positive electrode of the organic light emitting element 201 can be set, in advance, to an electric potential between the electric potential Vchar1 and the electric potential of the positive electrode of the organic light emitting element 201 in the light emission period, before the light emission. Therefore, the light emission of the organic light emitting element 201 can be started earlier in the light emission period, and the organic light emitting device 101 can be driven faster.

At the time t10, the writing transistor 203 and the charging transistor 205 enter the OFF state again, and the electric potential of the terminal A is switched from the electric potential Vchar2 to the electric potential Vchar1. In the present exemplary embodiment, the charging period coincides with the signal writing period. However, the charging period may be at least a part of a period between the threshold correction period and the light emission period.

In a case where the gate of the driving transistor 202 is in a floating state, when the electric potential of the terminal A is switched from the electric potential Vchar1 to the electric potential Vchar2, the electric potential varies due to a gate-source capacitance of the driving transistor 202. Therefore, the period in which the writing transistor 203 is in the ON state and the period in which the electric potential of the terminal A is the electric potential Vchar2 overlap, as illustrated in FIG. 3.

At a time t11, the light emission driving transistor 204 enters the ON state. An electric current is thereby supplied from the power supply line 209 to the organic light emitting element 201 via the driving transistor 202. As a result, the electric potential of the positive electrode of the organic light emitting element 201 transitions from the electric potential Vchar2 to an electric potential Vemit corresponding to a luminance signal. The light emitting element 201 thereby emits light.

The time required for the electric potential of the positive electrode of the organic light emitting element 201 to transition from the electric potential Vchar2 to the electric potential Vemit can be shorter, as the electric potential Vchar2 is closer to the electric potential Vemit. Therefore, it is possible to improve the responsiveness of luminance to an input signal of the organic light emitting device 101, by performing the charging operation.

The electric potential Vchar2 may be higher than an electric potential (Vcath+Vthel) determined by adding a light emission threshold (Vthel) to the electric potential (Vcath) of the negative electrode of the organic light emitting element 201. However, the electric potential Vchar2 is the electric potential (Vcath+Vthel) or less. It is possible to suppress the light emission of the organic light emitting element 201 in the non-light emission period, by having the electric potential Vchar2 equal to the electric potential (Vcath+Vthel) or less.

The electric current flowing through the driving transistor 202 is made constant without depending on threshold variation of the driving transistor 202 of each of the pixels 102, by the threshold correction processing in the period from the time t6 to the time t7, if the signal voltages Vsig is the same. Therefore, high quality display can be realized. The period from the time t1 to the time t11 is the non-light emission period.

At a time t12, the electric potential of the signal line 111 is switched from the signal voltage Vsig to the reference voltage Vofs. At this moment, the writing transistor 203 is in the OFF state. Therefore, the electric current supplied to the organic light emitting element 201 via the driving transistor 202 remains unchanged. Hence, the organic light emitting element 201 maintains the light emission of a constant luminance.

The organic light emitting device of the present exemplary embodiment has the electric potential setting unit 210 connected to the node N between the driving transistor 202 and the organic light emitting element 201. The electric potential setting unit 210 can set at least two different electric potentials at the node N. Specifically, the organic light emitting device has the terminal A, and the charging transistor 205 disposed between the node N and the terminal A. The node N is provided between the organic light emitting element 201 and the driving transistor 202. In the present exemplary embodiment, the terminal A is set to an electric potential for setting at least two different electric potentials at the node N.

An electric potential suitable for each of the threshold correction period and the charging period can be supplied to the organic light emitting element 201 and the driving transistor 202, by providing the above-described configuration. This can reduce the period until the light emission of the organic light emitting element 201 in the charging period, while reducing the time required for stabilizing the gate-source voltage of the driving transistor 202 in the threshold correction period. Therefore, the organic light emitting device 101 can be driven faster.

In the present exemplary embodiment, there is described the example in which the driving transistor 202 is connected to the positive electrode of the organic light emitting element 201, but other configuration may be adopted. For example, the driving transistor 202 may be connected to the negative electrode of the organic light emitting element 201, and the driving transistor 202 may be an N-type transistor. In this case, in the charging period, a voltage to be applied to the negative electrode of the organic light emitting element 201 may be a lowest possible voltage, which is close to an electric potential corresponding to a luminance signal. Therefore, the electric potential of the terminal A in the charging period is the electric potential Vchar2 that is lower than the electric potential Vchar1 of the terminal A in the threshold correction period. Hence, the organic light emitting device can be driven faster, as in the above-described example.

Figure 4:
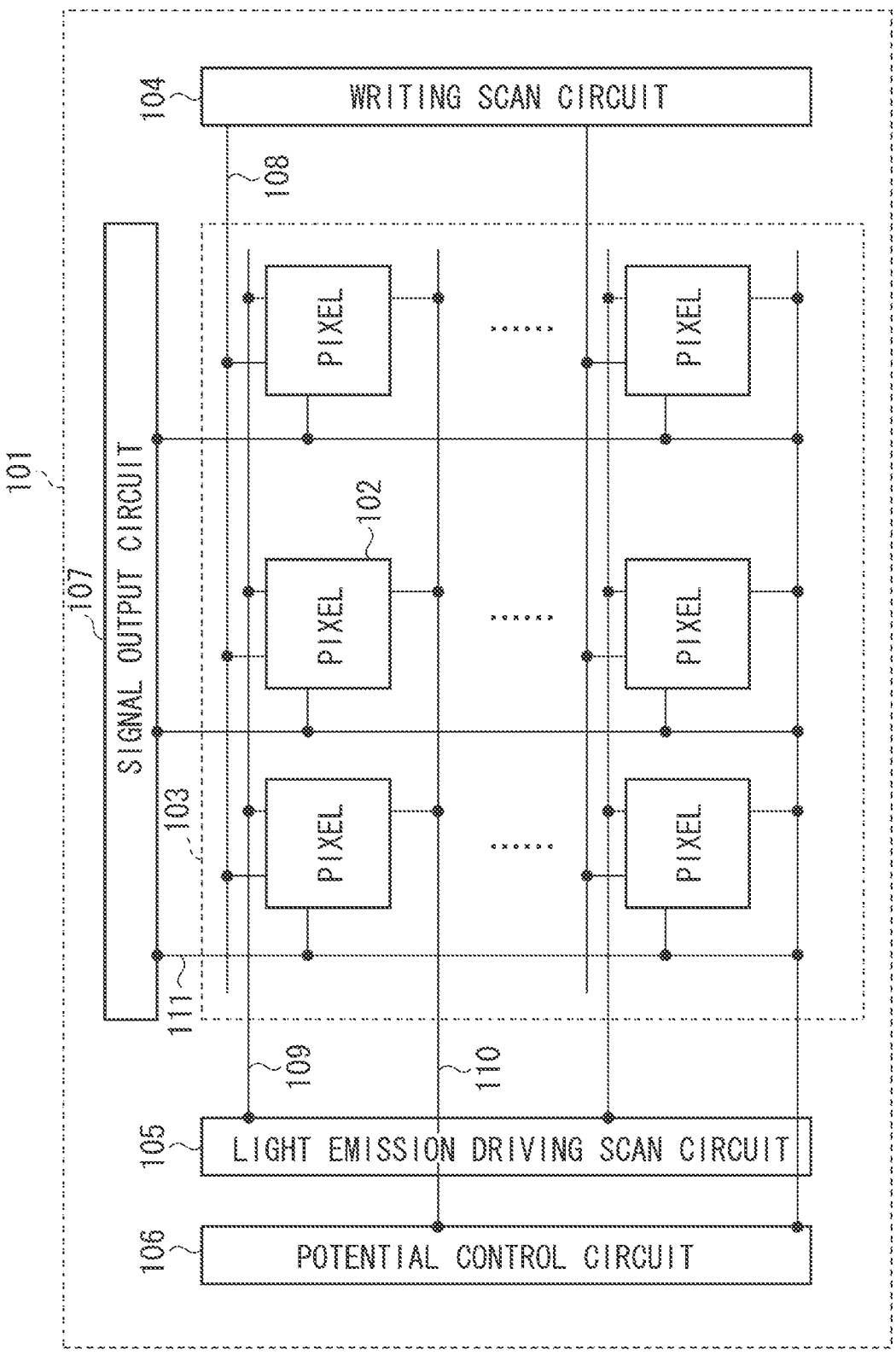
FIG. 4 is a system diagram illustrating an example of a part of another light emitting device according to the first exemplary embodiment.
Figure 5:
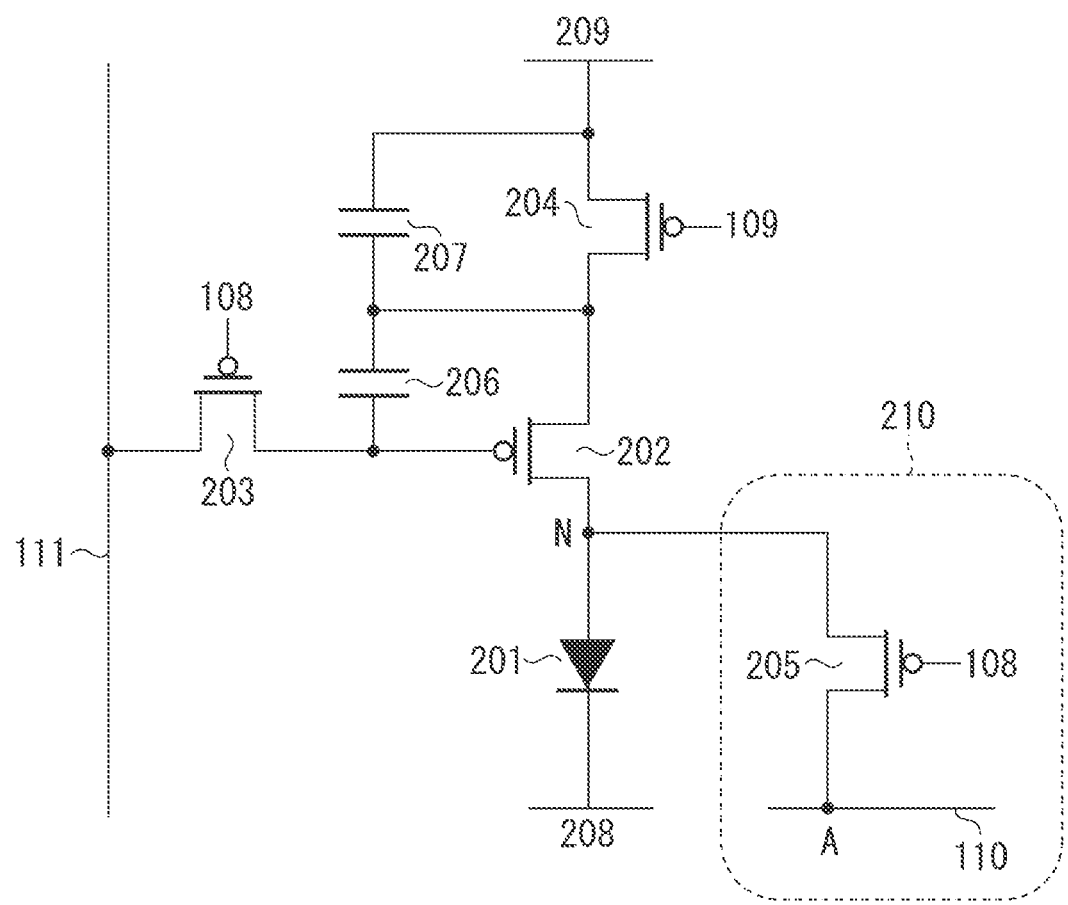
FIG. 5 is a circuit diagram illustrating an example of a pixel of another light emitting device according to the first exemplary embodiment.

As illustrated in FIG. 4 and FIG. 5, there may be adopted a configuration in which the gate of the charging transistor 205 is connected to the first scanning wire 108, instead of being connected to the fourth scanning wire 113. In this case, a period in which the electric potential of the terminal A becomes the electric potential Vchar2 occurs before the threshold correction preparation period. However, the electric potential of the terminal A becomes the electric potential Vchar1 in the threshold correction period. Therefore, there is no impairment to the above-described effect of reducing the time required for stabilizing the gate-source voltage of the driving transistor 202 in the threshold correction period.

Further, during the period in which the writing transistor 203 and the charging transistor 205 in the non-light emission period are each in the ON state, the electric potential Vchar2, which is higher than the electric potential Vchar1, is applied to the positive electrode of the organic light emitting element 201. However, if the electric potential Vchar2 is a value not exceeding the luminance specification for non-light emission of the organic light emitting device 101, the use of the organic light emitting device 101 as a display device is not affected.

In a case where the gate of the charging transistor 205 is connected to the first scanning wire 108, the fourth scanning wire 113 and the charging scan circuit 112 are unnecessary. Therefore, the size of the organic light emitting device 101 can be reduced, or a pixel region can be increased.

In the present exemplary embodiment, the electric potential setting unit 210 has the terminal A capable of supplying two or more electric potentials to the organic light emitting element 201. Further, the electric potential setting unit 210 has the charging transistor 205 connected between the node N and the terminal A. The node N is provided between the organic light emitting element 201 and the driving transistor 202. However, the electric potential setting unit 210 is not limited to this configuration. For example, a configuration for controlling a voltage to be applied to the gate of the charging transistor 205 may be adopted. In this case, when the light emission driving transistor 204 is in the OFF state in the charging period, the electric potential of the positive electrode of the organic light emitting element 201 is the electric potential Vchar2. Therefore, an electric current is to flow between the positive electrode of the organic light emitting element 201 and the terminal A. Hence, the electric potential setting unit 210 may have, in addition to the charging transistor 205 and the terminal A, a transistor connected between a point, which is provided between the organic light emitting element 201 and the charging transistor 205, and a power supply line.

In the present exemplary embodiment, the example in which the organic light emitting device has the organic light emitting element 201 is described. However, an inorganic light emitting device, which has an inorganic light emitting element in place of the organic light emitting element 201, may be adopted. It is possible to speed up the driving in this case as well.

A second exemplary embodiment will be described. In the second exemplary embodiment, an example, in which the organic light emitting device described in the first exemplary embodiment is applied to an electronic apparatus, will be described with reference to FIG. 6.

Figure 6:
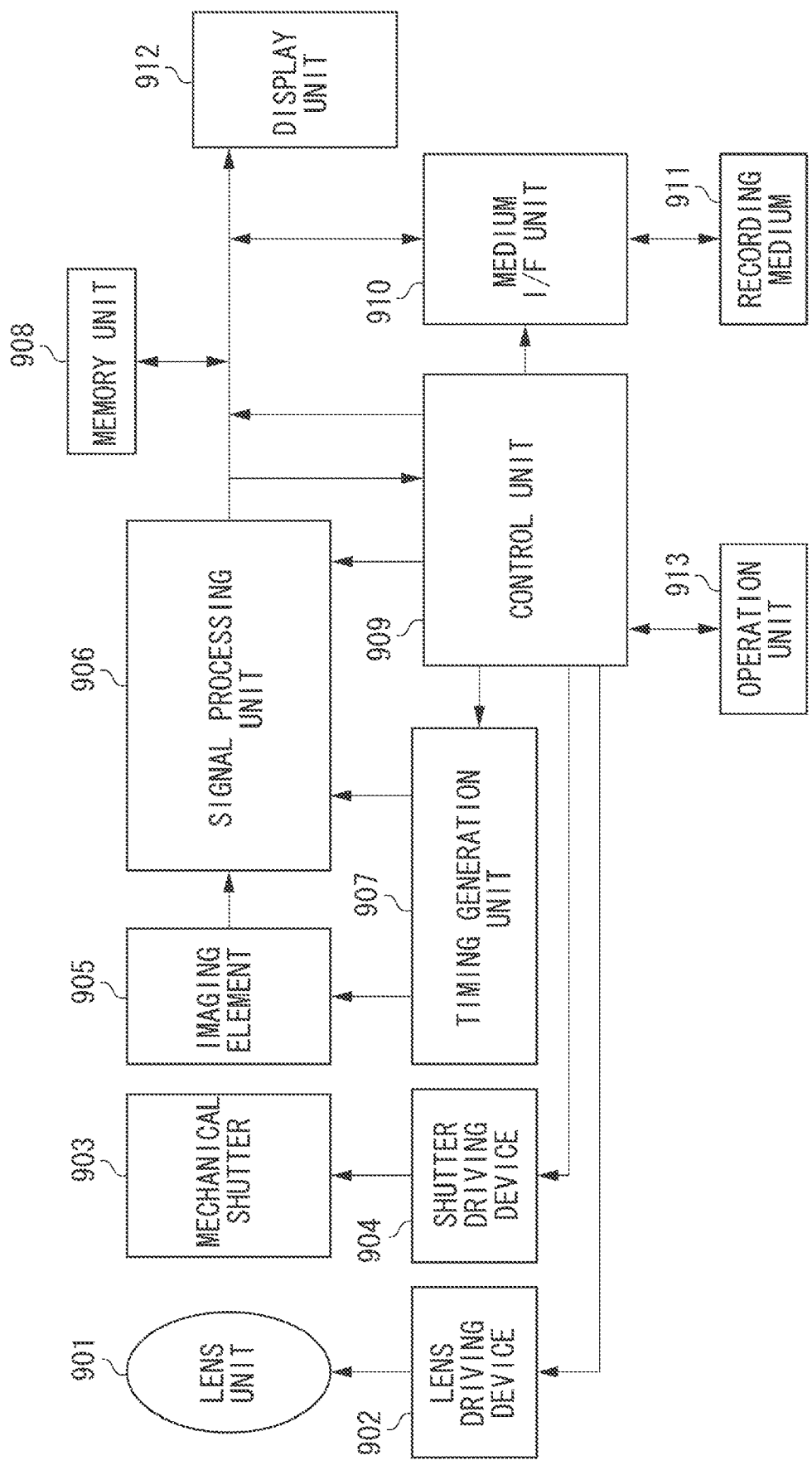
FIG. 6 is a diagram illustrating an example of an electronic apparatus according to a second exemplary embodiment.

Specifically, in the present exemplary embodiment, the above-described organic light emitting device is applied to a digital camera, and this example will be described with reference to FIG. 6. A lens unit 901 is an imaging optical system for forming an optical image of an object on an imaging element 905. The lens unit 901 includes a focus lens, a variable magnification lens, and a diaphragm. A control unit 909 controls driving for adjustment of the position of the focus lens, the position of the variable magnification lens, and the opening diameter of the diaphragm in the lens unit 901, via a lens driving device 902.

A mechanical shutter 903 is disposed between the lens unit 901 and the imaging element 905. Driving of the mechanical shutter 903 is controlled by the control unit 909 via a shutter driving device 904. The imaging element 905 is disposed to receive light from the lenses, and converts an optical image formed in the lens unit 901 into an image signal by using a plurality of pixels.

The image signal output from the imaging element 905 is input into a signal processing unit 906. The signal processing unit 906 performs A/D conversion, demosaic processing, white balance adjustment processing, and encoding processing on the image signal. The signal processing unit 906 also executes focus detection processing for detecting a defocusing amount and a direction, by using a phase-difference detection method based on a signal obtained from the image signal output by the imaging element 905.

A timing generation unit 907 outputs various timing signals to the imaging element 905 and the signal processing unit 906. The control unit 909 has, for example, a memory (a read only memory (ROM), and a random access memory (RAM)) and a microprocessor (a central proceeding unit (CPU)). The control unit 909 implements various functions of the digital camera, by loading a program stored in the ROM into the RAM, and causing the CPU to control each unit by executing the loaded program. The functions implemented by the control unit 909 include automatic focus (AF) detection and automatic exposure (AE) control. The control unit 909 receives a signal based on a signal output from the imaging element 905, and inputs a signal for an electronic viewfinder into a display unit 912.

A memory unit 908 is used as a memory into which the control unit 909 and the signal processing unit 906 temporarily store image data, or is used as a work area. A medium interface (I/F) unit 910 is an interface for reading from and writing into a recording medium 911, which is, for example, a detachable memory card. The display unit 912 is used to display captured images and various kinds of information of the digital camera. An operation unit 913 is a user interface including a power supply switch, a release button, and a menu button. A user provides an instruction and performs setting in the digital camera via the operation unit 913.

The organic light emitting device described in the first exemplary embodiment is used for the display unit 912. An image to be captured can be thereby displayed faster.

The operation of the digital camera in image-capturing will be described. When the power switch is turned on, the digital camera enters an image capturing stand-by state. The control unit 909 starts moving-image capturing processing and display processing for causing the display unit 912 to operate as the electronic viewfinder. When a shooting preparation instruction is input (e.g., the release button of the operation unit 913 is half-pressed) in the shooting stand-by state, the control unit 909 starts the focus detection processing. For example, the control unit 909 can perform the focus detection processing by using a phase-difference detection method. Specifically, the control unit 909 obtains a defocusing amount and a direction, by determining an image misalignment amount based on a phase difference of signal waveforms formed by linking signals of the same type of an A image signal and a B image signal obtained from a plurality of pixels.

The control unit 909 then determines a movement amount and a movement direction of the focus lens of the lens unit 901, based on the obtained defocusing amount and direction. The control unit 909 thereby drives the focus lens via the lens driving device 902, and adjusts the focal point of the imaging optical system. Upon this driving, the control unit 909 may perform a fine adjustment of the focus lens position, by further performing focus detection based on a contrast evaluation value as necessary.

Afterward, when a shooting start instruction is input (e.g., the release button is fully pressed), the control unit 909 executes shooting operation for recording, and processes obtained image data by using the signal processing unit 906. The control unit 909 stores the processed image data into the memory unit 908. The control unit 909 records the image data stored in the memory unit 908 into the recording medium 911 via the medium I/F unit 910. The image data may be output to an external apparatus such as a computer, via an external I/F unit (not illustrated).

The display unit 912 of such an imaging apparatus is expected to have a small area per unit pixel, as compared with a display apparatus such as a television set. Therefore, if the gate length of a transistor is made smaller by reducing the size of each pixel, the influence of the channel-length modulation effect increases. Hence, the organic light emitting device according to the first exemplary embodiment is used. This results in a remarkable reduction in the threshold correction period obtained by utilizing an increase in the source-drain electric current of the driving transistor 202 by the channel-length modulation effect. Accordingly, the organic light emitting device 101 serving as the display unit 912 can be driven faster, and the real time performance of the display unit 912 can be improved.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-105986, filed May 29, 2017, which is hereby incorporated by reference herein in its entirety.

What is claimed is:

1. A light emitting device comprising:
   a light emitting element;
   a first transistor in which one of a source and a drain is connected to the light emitting element;
   a second transistor connected to a node between the first transistor and the light emitting element;
   a third transistor connected between a gate of the first transistor and a signal line; and
   a fourth transistor connected between the other one of the source and the drain of the first transistor and a power supply line;
   a potential control circuit configured to control an electric potential of a terminal,
   wherein the node is connected to the terminal via the second transistor, the terminal in a driving state being configured to have at least a first electric potential and a second electric potential different from the first electric potential,
   wherein the second electric potential is an electric potential between the first electric potential and an electric potential of the power supply line, and
   wherein the potential control circuit controls the electric potential of the terminal to be the first electric potential, in a period in which a voltage between the gate of the first transistor and the one of the source and the drain of the first transistor is a threshold voltage of the first transistor.

2. The light emitting device according to claim 1, further comprising a capacitor connected between the gate of the first transistor and a connecting portion between the third transistor and the first transistor.

3. The light emitting device according to claim 2, wherein the capacitor has a first conductive layer connected to the gate of the first transistor, a second conductive layer connected to a connecting portion between the first transistor and the fourth transistor, and an insulation layer disposed between the first conductive layer and the second conductive layer.

4. The light emitting device according to claim 1, wherein the potential control circuit controls the electric potential of the terminal to be the second electric potential, before the light emitting element emits light, after the first electric potential is supplied.

5. The light emitting device according to claim 1,
   wherein the second electric potential is an electric potential between the first electric potential and an electric potential of the power supply line,
   wherein the electric potential of the terminal is the first electric potential, in a first period in which the second transistor and the third transistor are each in an ON state, and the fourth transistor is in an OFF state, and
   wherein the electric potential of the terminal is the second electric potential, when the second transistor is switched to an OFF state, before the fourth transistor is switched to an ON state, after the first period.

6. The light emitting device according to claim 5, wherein the electric potential of the terminal is the first electric potential, when the fourth transistor is switched to the OFF state, in a second period in which the second transistor and the third transistor are each in the ON state.

7. The light emitting device according to claim 5, wherein a period in which the third transistor is in the ON state and a period in which the electric potential of the terminal is the second electric potential overlap, before the fourth transistor is switched to the ON state, after the first period.

8. The light emitting device according to claim 1,
wherein the light emitting element has a first electrode, a second electrode, and a light emission layer disposed between the first electrode and the second electrode,
wherein the second transistor is connected to the first electrode of the light emitting element, and
wherein the second electric potential is an electric potential at which a voltage between the first electrode and the second electrode of the light emitting element is smaller than a threshold voltage of the light emitting element.

9. The light emitting device according to claim 1, wherein the first transistor is a P-type transistor.

10. The light emitting device according to claim 1, wherein each of the second transistor, the third transistor, and the fourth transistor is a P-type transistor.

11. The light emitting device according to claim 1, wherein the one of the source and the drain of the first transistor is connected to a positive electrode of the light emitting element, and the second electric potential is higher than the first electric potential.

12. The light emitting device according to claim 1,
wherein the fourth transistor is switched to an ON state, in a period in which the second transistor is in an ON state, and the third transistor is in an OFF state,
wherein the third transistor is switched to an ON state, in a state where a third electric potential is supplied to the signal line, after the fourth transistor is switched to the ON state,
wherein the fourth transistor is switched to an OFF state, while the second transistor remains in the ON state, after the third transistor is switched to the ON state,
wherein the third transistor is switched to the OFF state, after the fourth transistor is switched to the OFF state,
wherein the electric potential of the signal line is changed to a fourth electric potential that is lower than the third electric potential and corresponds to a luminance of the light emitting element, after the third transistor is switched to the OFF state,
wherein the third transistor is switched to the ON state and the electric potential of the terminal is changed from the first electric potential to the second electric potential, while the second transistor remains in the ON state and the fourth transistor remains in the OFF state, after the electric potential of the signal line is changed to the fourth electric potential,
wherein the second transistor is switched to an OFF state and the third transistor is switched to the OFF state, after the third transistor is switched to the ON state, and
wherein the fourth transistor is switched to the ON state, after the second transistor and the third transistor are each switched to the OFF state.

13. The light emitting device according to claim 12, wherein the electric potential of the terminal is switched from the second electric potential to the first electric potential, when the second transistor and the third transistor are each switched to the OFF state, after the third transistor is switched to the ON state.

14. An imaging apparatus comprising: an imaging element disposed to receive light and convert an optical image into an image signal by using plurality of pixels; a control unit configured to receive an output from the imaging element; and the light emitting device according to claim 1, the light emitting device being configured to receive a signal from the control unit.

15. A light emitting device comprising:
a light emitting element;
a driving transistor configured to control driving of the light emitting element;
a threshold correction circuit configured to perform compensation for a voltage corresponding to a threshold of the driving transistor; and an electric potential setting circuit configured to set an electric potential of a node between the driving transistor and the light emitting element,
wherein, in a driving state, the electric potential setting circuit sets a first electric potential and a second electric potential different from the first electric potential, at the node in the driving state,
wherein the second electric potential is an electric potential between the first electric potential and an electric potential of the power supply line, and
wherein the potential control circuit controls the electric potential of the terminal to be the first electric potential, in a period in which a voltage between the gate of the first transistor and the one of the source and the drain of the first transistor is a threshold voltage of the first transistor.

16. The light emitting device according to claim 15, wherein the electric potential setting circuit sets the second electric potential as the electric potential of the node, before light emission of the light emitting element, after the compensation.

17. The light emitting device according to claim 16, wherein each of the first electric potential and the second electric potential is an electric potential, at which a source-drain voltage of the driving transistor, when the compensation for the voltage corresponding to the threshold of the driving transistor is performed, exceeds the source-drain voltage of the driving transistor, before the light emission of the light emitting element after the compensation for the voltage corresponding to the threshold of the driving transistor is performed.

18. The light emitting device according to claim 15, wherein the electric potential setting circuit has a charging transistor in which one of a source and a drain is connected to a terminal and the other one of the source and the drain is connected to the node, and wherein the first electric potential and the second electric potential are selectively supplied by switching an electric potential of the terminal.

19. The light emitting device according to claim 15, wherein the node is connected to a positive electrode of the light emitting element, and the second electric potential is higher than the first electric potential.

20. The light emitting device according to claim 15, wherein the electric potential setting circuit sets the first electric potential as the electric potential of the node, when performing the compensation for the voltage corresponding to the threshold.

* * * * *